United States Patent
Omura et al.

(10) Patent No.: US 8,536,958 B2
(45) Date of Patent: *Sep. 17, 2013

(54) ELASTIC WAVE DUPLEXER HAVING A SEALING MEMBER INCLUDING TWO DIELECTRIC MATERIALS

(75) Inventors: Masashi Omura, Nagaokakyo (JP); Daisuke Miyazaki, Nagaokakyo (JP); Ryoichi Omote, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 373 days.

This patent is subject to a terminal disclaimer.

(21) Appl. No.: 12/987,214

(22) Filed: Jan. 10, 2011

(65) Prior Publication Data

US 2011/0175688 A1  Jul. 21, 2011

(30) Foreign Application Priority Data

Jan. 20, 2010 (JP) ................................. 2010-010279

(51) Int. Cl.
*H03H 9/70* (2006.01)
*H03H 9/72* (2006.01)

(52) U.S. Cl.
USPC .......................................... 333/133; 333/193

(58) Field of Classification Search
USPC ................... 333/133, 193; 310/313 R, 313 B
See application file for complete search history.

(56) References Cited

U.S. PATENT DOCUMENTS

| | | | | |
|---|---|---|---|---|
| 6,181,015 B1 * | 1/2001 | Gotoh et al. | ................... | 257/778 |
| 6,351,194 B2 * | 2/2002 | Takahashi et al. | ............ | 333/133 |
| 6,663,943 B2 * | 12/2003 | Kadota | ............................ | 428/156 |
| 6,784,765 B2 * | 8/2004 | Yamada et al. | ................ | 333/193 |
| 6,914,367 B2 * | 7/2005 | Furukawa | ..................... | 310/340 |
| 7,474,175 B2 * | 1/2009 | Furihata et al. | ............... | 333/193 |
| 7,609,129 B2 * | 10/2009 | Yokota et al. | ................. | 333/133 |
| 2009/0091404 A1 * | 4/2009 | Takamine | ..................... | 333/195 |
| 2011/0175689 A1 * | 7/2011 | Omura et al. | ................. | 333/133 |

FOREIGN PATENT DOCUMENTS

| | | | |
|---|---|---|---|
| JP | 2002-100945 A | | 4/2002 |
| JP | 2003-087095 A | | 3/2003 |
| JP | 2003-258162 | * | 9/2003 |
| JP | 2004-208326 A | | 7/2004 |

OTHER PUBLICATIONS

English language machine translation of JP 2003-258162, published Sep. 12, 2003.*
Omura et al., "Elastic Wave Duplexer," U.S. Appl. No. 12/987,215, filed Jan. 10, 2011.

* cited by examiner

*Primary Examiner* — Barbara Summons
(74) *Attorney, Agent, or Firm* — Keating & Bennett, LLP

(57) ABSTRACT

A transmission elastic wave filter element and a reception elastic wave filter element each flip-chip mounted to a principal surface of a substrate are sealed off by a sealing member. The sealing member includes a base portion in contact with the principal surface of the substrate and made of a first dielectric material, and a lower dielectric-constant portion made of a second dielectric material having a dielectric constant lower than that of the first dielectric material and arranged in at least one of a region of the sealing member that faces the transmission elastic wave filter element on a side opposite from the substrate with respect to the transmission elastic wave filter element, and a region of the sealing member that faces the reception elastic wave filter element on the side opposite from the substrate with respect to the reception elastic wave filter element.

7 Claims, 16 Drawing Sheets

ELASTIC WAVE DUPLEXER HAVING A SEALING MEMBER INCLUDING TWO DIELECTRIC MATERIALS

BACKGROUND OF THE INVENTION

1. Field of the Invention

The present invention relates to an elastic wave duplexer and more particularly to an elastic wave duplexer, which is flip-chip mounted to a substrate and which includes a transmission elastic wave filter element and a reception elastic wave filter element, both the filter elements being sealed off.

2. Description of the Related Art

Various conventional surface acoustic (elastic) wave devices have been proposed in which surface acoustic wave elements are mounted to a substrate and are sealed off by using a sealing resin.

For example, Japanese Unexamined Patent Application Publication No. 2002-100945 discloses a surface acoustic wave device illustrated in a sectional view of FIG. 15. The disclosed surface acoustic wave device includes, as illustrated in FIG. 15, a mounting substrate 110, a surface acoustic wave element 120 mounted onto the mounting substrate 110, and a sealing member 130 for air-tightly sealing off the surface acoustic wave element 120. After forming a plurality of surface acoustic wave devices on a bulk substrate 140, the surface acoustic wave devices are cut at cut positions 141 into individual devices. The mounting substrate 110 includes conductor patterns 111 formed on one surface thereof. The conductor patterns 111 are extended to pass through the mounting substrate 110 and are connected to electrodes disposed on the other surface of the mounting substrate 110. The mounting substrate 110 is made of, e.g., a ceramic or a resin. The surface elastic wave element 120 includes a piezoelectric substrate 121, comb-shaped electrodes 122 and conductor patterns 123 both formed on one surface of the piezoelectric substrate 121, and bumps 124 made of, e.g., gold and formed at ends of the conductor patterns 123. The conductor patterns 123 are electrically connected to the comb-shaped electrodes 122. The surface acoustic wave element 120 is an element utilizing surface acoustic waves generated by the comb-shaped electrodes 122, and it is employed as a filter element, a resonator, etc.

The surface acoustic wave element 120 is mounted onto the mounting substrate 110 such that the comb-shaped electrodes 122 and the one surface of the mounting substrate 110 are positioned to face each other while a space 133 is formed therebetween. Further, the bumps (connecting electrodes) 124 are electrically connected to the conductor patterns 111 on the mounting substrate 110 by flip-chip bonding. The sealing member 130 is made of a sealing material 150 applied so as to cover the surface acoustic wave element 120 except for the space 133 that is formed between the comb-shaped electrodes 122 and the one surface of the mounting substrate 110. The sealing material 150 is, e.g., a resin which has, before a hardening process, not only fluidity, but also viscosity at such a level as to not allow the resin to easily enter the space 133, and which is hardened and dried by the hardening process.

Also, Japanese Unexamined Patent Application Publication No. 2003-87095 discloses a surface acoustic wave device illustrated in FIGS. 16A and 16B. FIG. 16A is a perspective view of the surface acoustic wave device. FIG. 16B is a sectional view taken along a line A-A' in FIG. 16A. The disclosed surface acoustic wave device includes, as illustrated in FIGS. 16A and 16B, a surface acoustic wave element 201 having comb-shaped electrodes 214a and 214b, bumps 205a to 205g disposed on the surface acoustic wave element 201, a base substrate 204 electrically and mechanically connected to the surface acoustic wave element 201 through the bumps 205a to 205g, and a sealing member 202 for protecting the surface acoustic wave element 201 against mechanical stresses and environmental stresses. The surface acoustic wave element 201 is mounted to the base substrate 204 by applying ultrasonic waves to the surface acoustic wave element 201 to melt the bumps 205a to 205g, and by joining the base substrate 204 and the surface acoustic wave element 201 to each other. A surface of the surface acoustic wave element 201 on which the comb-shaped electrodes 214a and 214b are disposed is sealed off by the sealing member 202 that is coated over the base substrate 204 and the backside of the surface acoustic wave element 201. The bumps 205a to 205g are made of, e.g., gold or silver. The sealing member 202 functions as a surface protective film for the surface acoustic wave element 201. Thus, the sealing member 202 can protect the surface acoustic wave element 201 against mechanical stresses and environmental stresses. The sealing member 202 is made of, e.g., a polymeric material, such as a polyimide resin or a PP/EPR-based polymer alloy. The surface acoustic wave element 201 includes a piezoelectric substrate 203 made of, e.g., lithium tantalate or lithium niobate, the comb-shaped electrodes 214a and 214b disposed on one principal surface of the piezoelectric substrate 203, which is positioned to face the base substrate 204, and bonding pads electrically connected to the comb-shaped electrodes 214a and 214b and disposed on the same plane on which the comb-shaped electrodes 214a and 214b are disposed. In addition, the bumps 205a to 205g are connected to the bonding pads for supplying signals, etc., to the comb-shaped electrodes 214a and 214b from the base substrate 204.

When the structures illustrated in FIG. 15 and FIGS. 16A and 16B are each applied to an elastic wave duplexer including a surface acoustic wave filter element for transmission and a surface acoustic wave filter element for reception, the surface acoustic wave filter element for transmission and the surface acoustic wave filter element for reception are flip-chip mounted to a substrate and are sealed off by using a sealing resin. One principal surface of the surface acoustic wave filter element, on which comb-shaped electrodes are formed, is positioned to face the substrate, and a sealing member made of a polymeric material (resin) is coated over the other principal surface of the surface acoustic wave filter element on the side farthest away from the substrate. Direct reaching waves are generated due to capacitance that is produced on the other principal surface of the surface acoustic wave filter element with the presence of the sealing member.

More specifically, assuming, for example, a surface acoustic wave filter element 60 having two terminal pairs, i.e., input terminals 61 and 62 and output terminals 63 and 64, as illustrated in a circuit diagram of FIG. 11, there occur signals that are directly transmitted from the input terminals 61 and 62 to the output terminals 63 and 64 without passing through the surface acoustic wave filter element 60 as indicated by arrows 70 and 72 in a circuit diagram of FIG. 12. Those signals are called "direct reaching waves".

As illustrated in an equivalent circuit diagram of FIG. 13, the direct reaching waves include a component 74 attributable to mutual inductance between the input terminals 61 and 62 and the output terminals 63 and 64, a component 76 attributable to capacitive coupling between the input terminals 61 and 62 and the output terminals 63 and 64, a component 78 attributable to floating of the ground, etc.

The direct reaching waves degrade an isolation characteristic between a transmission terminal and a first reception terminal and between the transmission terminal and a second reception terminal of the elastic wave duplexer.

SUMMARY OF THE INVENTION

In view of the problems described above, preferred embodiments of the present invention provide an elastic wave duplexer having improved isolation characteristics.

An elastic wave duplexer according to a preferred embodiment of the present invention includes (a) a substrate, (b) a transmission elastic wave filter element that is flip-chip mounted to a principal surface of the substrate, (c) a reception elastic wave filter element that is flip-chip mounted to the principal surface of the substrate, and (d) a sealing member arranged on the principal surface of the substrate to cover the transmission elastic wave filter element and the reception elastic wave filter element, which are flip-chip mounted to the principal surface of the substrate, and sealing off the transmission elastic wave filter element and the reception elastic wave filter element. The sealing member includes (i) a base portion in contact with the principal surface of the substrate and made of a first dielectric material, and (ii) a lower dielectric-constant portion made of a second dielectric material having a lower dielectric constant than the first dielectric material and located in at least one of a region of the sealing member that faces the transmission elastic wave filter element on a side opposite from the substrate with respect to the transmission elastic wave filter element and a region of the sealing member that faces the reception elastic wave filter element on a side opposite from the substrate with respect to the reception elastic wave filter element.

In the arrangement described above, the transmission elastic wave filter element and the reception elastic wave filter element are flip-chip mounted to the same principal surface of the substrate and are sealed off by the sealing member. The lower dielectric-constant portion having a lower dielectric constant than the base portion of the sealing member is located in the region of the sealing member that faces the transmission elastic wave filter element on the side opposite from the substrate with respect to the transmission elastic wave filter element, i.e., a region of the sealing member covering the transmission elastic wave filter element, and/or in the region of the sealing member that faces the reception elastic wave filter element on the side opposite from the substrate with respect to the reception elastic wave filter element, i.e., a region of the sealing member covering the reception elastic wave filter element. The sealing member may include portions other than the base portion and the lower dielectric-constant portion.

With the above-described features, since the lower dielectric-constant portion having a relatively low dielectric constant is arranged to face the transmission elastic wave filter element and/or the reception elastic wave filter element, a capacitance component causing direct reaching waves can be reduced in comparison with the case where the sealing member is entirely formed of a dielectric material having the same dielectric constant. Thus, the direct reaching waves can be reduced. It is therefore possible to prevent a phenomenon such that, between input terminals and output terminals of the transmission elastic wave filter element and the reception elastic wave filter element, signals are directly transmitted without passing through the transmission elastic wave filter element and the reception elastic wave filter element. As a result, a high degree of isolation can be realized between a transmission terminal and a first reception terminal and between the transmission terminal and a second reception terminal of the elastic wave duplexer.

In one preferred embodiment of the present invention, the lower dielectric-constant portion of the sealing member is arranged such that a gap is provided corresponding to at least one of the transmission elastic wave filter element and the reception elastic wave filter element. A thickness of the lower dielectric-constant portion of the sealing member is larger than at least one of a thickness of the sealing member interposed between the lower dielectric-constant portion of the sealing member and the transmission elastic wave filter element and a thickness of the sealing member interposed between the lower dielectric-constant portion of the sealing member and the reception elastic wave filter element.

With such a feature, the lower dielectric-constant portion is arranged to face the transmission elastic wave filter element and/or the reception elastic wave filter element through the base portion that is thinner than the lower dielectric-constant portion. Since the transmission elastic wave filter element and/or the reception elastic wave filter element can be sealed off only by the base portion, a degree of freedom in selecting the second dielectric material, which is used to form the lower dielectric-constant portion, is increased.

In another preferred embodiment of the present invention, the lower dielectric-constant portion of the sealing member is in contact with at least one of the transmission elastic wave filter element on a side thereof located opposite from the substrate and the reception elastic wave filter element on a side thereof located opposite from the substrate.

With such a feature, since the lower dielectric-constant portion is disposed in contact with the transmission elastic wave filter element and/or the reception elastic wave filter element, the capacitance component can be reduced and hence the direct reaching waves can be reduced in comparison with the case where the lower dielectric-constant portion is arranged to face the transmission elastic wave filter element and/or the reception elastic wave filter element through the base portion.

Preferably, at least one of the first dielectric material and the second dielectric material is a resin. In such a case, the sealing member can be easily formed.

In still another preferred embodiment of the present invention, the transmission elastic wave filter element and the reception elastic wave filter element are preferably separate chip elements. In such a case, the elastic wave duplexer can be constructed by using two or more chip elements.

In still another preferred embodiment of the present invention, the transmission elastic wave filter element and the reception elastic wave filter element are defined by a single chip element. In such a case, a process of mounting the chip element to the substrate is simplified.

Preferably, the reception elastic wave filter element is a balanced filter element. In such a case, the isolation characteristic can be improved by reducing the thickness of the sealing member in a region above the balanced filter element, to thereby suppress the generation of capacitance and to reduce a direct reaching wave component.

The elastic wave duplexer according to each of the preferred embodiments of the present invention greatly improves the isolation characteristic.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Elastic wave duplexers according to preferred embodiments of the present invention will be described below with reference to FIGS. 1 to 10, 13 and 14.

First Preferred Embodiment

An elastic wave duplexer 10a according to a first preferred embodiment is described with reference to FIGS. 1 to 3.

Figure 1:
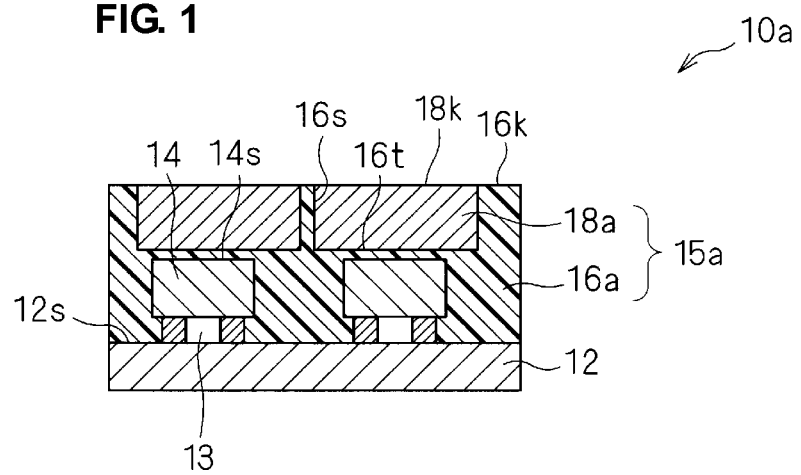
FIG. 1 is a sectional view of an elastic wave duplexer according to a first preferred embodiment of the present invention.

FIG. 1 is a sectional view of the elastic wave duplexer 10a. In the elastic wave duplexer 10a, as illustrated in FIG. 1, two chip elements 14, i.e., a transmission elastic wave filter element and a reception elastic wave filter element, are mounted to an upper surface 12s, i.e., one principal surface, of a substrate 12 by flip-chip bonding, and the two chip elements 14 are sealed off by a sealing member 15a.

The sealing member 15a is preferably made of a dielectric material, such as a resin. The sealing member 15a includes a base portion 16a and a lower dielectric-constant portion 18a. The base portion 16a is in contact with the upper surface 12s of the substrate 12, and recesses 16s are formed in an upper surface 16k of the base portion 16a, which is a surface that is located opposite from the substrate 12. The recesses 16s are each formed to face at least a portion of an upper surface 14s of the chip element 14. The lower dielectric-constant portion 18a is formed in the recess 16s by using a second dielectric material that has a lower dielectric constant than a first dielectric material used to form the base portion 16a.

Between the lower dielectric-constant portion 18a and the chip element 14, there is interposed a layer of the base portion 16a, which layer is thinner than the lower dielectric-constant portion 18a. In other words, the thickness of the lower dielectric-constant portion 18a (i.e., the dimension between an upper surface 18k of the lower dielectric-constant portion 18a and a bottom surface 16t of the recess 16s) is larger than the thickness of the sealing member 15a in a region above the chip element 14 (i.e., the dimension between the bottom surface 16t of the recess 16s and the upper surface 14s of the chip element 14).

A method of manufacturing the elastic wave duplexer 10a will be described below with reference to FIGS. 2 and 3. FIGS. 2 and 3 are each a sectional view to explain a manufacturing process of the elastic wave duplexer.

Figure 2:
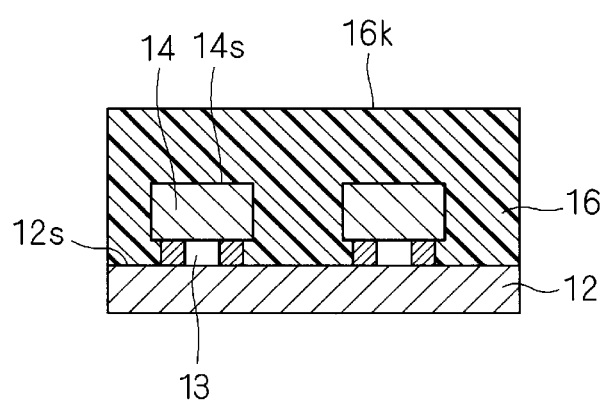
FIG. 2 is a sectional view to explain a manufacturing process of the elastic wave duplexer according to the first preferred embodiment of the present invention.

First, as illustrated in FIG. 2, the two chip elements 14, i.e., the transmission elastic wave filter element and the reception elastic wave filter element, are mounted to the upper surface 12s of the substrate 12, such as a ceramic substrate, by flip-chip bonding, and a not-yet-hardened sheet of resin 16 made of the first dielectric material is overlaid so as to cover the chip elements 14. The sheet of resin 16 is overlaid by applying, in a sheet-like shape, a resin which has, before a hardening process, not only fluidity, but also viscosity at a level that does not allow the resin to easily enter a space 13 between the substrate 12 and the chip element 14, and which is hardened and dried by the hardening process.

Figure 3:
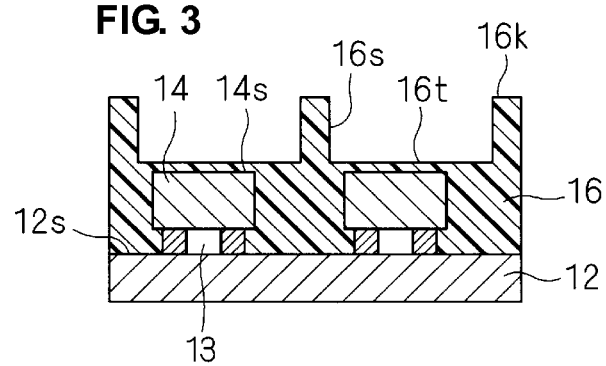
FIG. 3 is a sectional view to explain the manufacturing process of the elastic wave duplexer according to the first preferred embodiment of the present invention.

Then, as illustrated in FIG. 3, the recess 16s is formed in an upper surface 16k of the sheet of resin 16 at a position substantially facing the chip element 14. The recess 16s can be formed, for example, by a method of partially removing the sheet of resin 16 with, e.g., grinding after the sheet of resin 16 has been hardened by the hardening process. However, the method of forming the recess 16s is not limited to any particular one. As an alternative method, the sheet of resin 16 may be hardened after the recess 16s has been formed through the steps of providing a projection on a surface of a pressing jig to press the sheet of resin 16, the jig being used for press-bonding the sheet of resin 16 to the substrate 12, and of pressing the projection to bite into the upper surface 16k of the sheet of resin 16.

Then, the lower dielectric-constant portion 18a is formed, as illustrated in FIG. 1, by filling the second dielectric material into the recess 16s by a suitable method, such as coating or printing, for example.

Alternatively, the sheet of resin 16 may be hardened after pressing a member serving as the lower dielectric-constant portion 18a to bite into the not-yet hardened sheet of resin 16 such that the recess 16s and the lower dielectric-constant portion 18a are formed at the same time.

Figure 9:
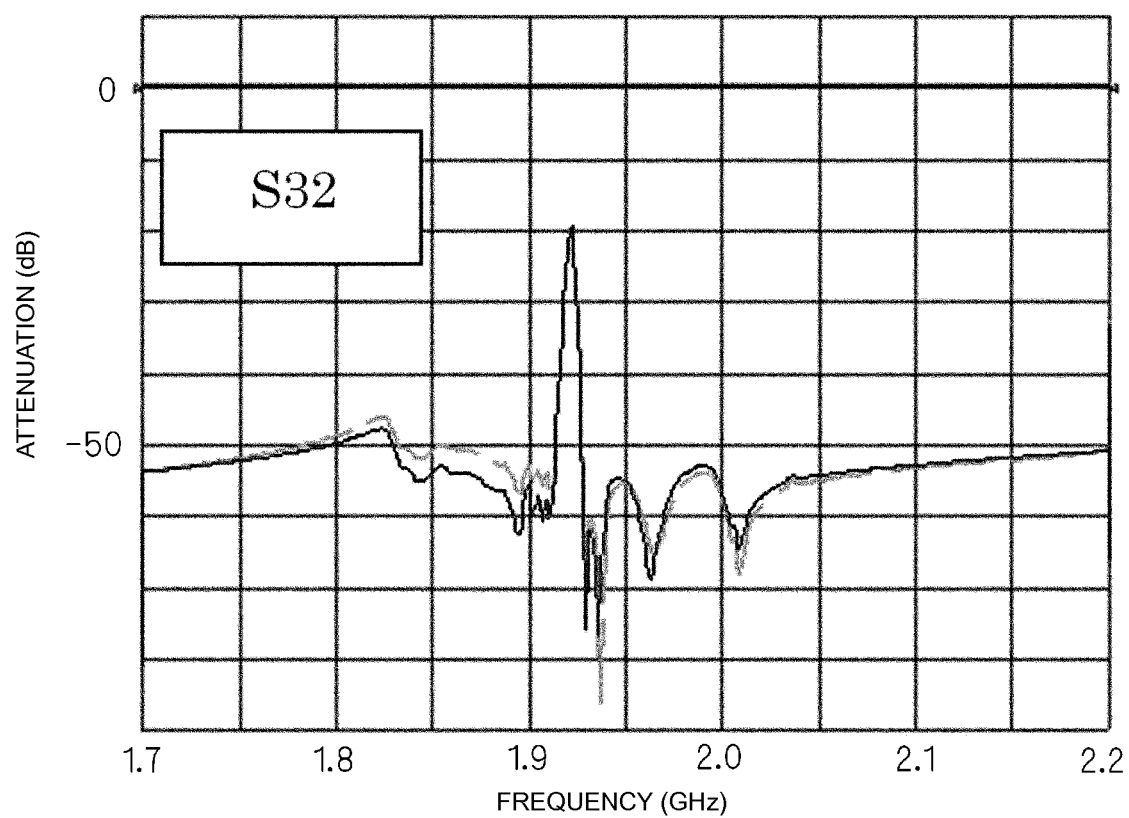
FIG. 9 is a graph illustrating an isolation characteristic according to the first preferred embodiment of the present invention and a comparative example.
Figure 10:
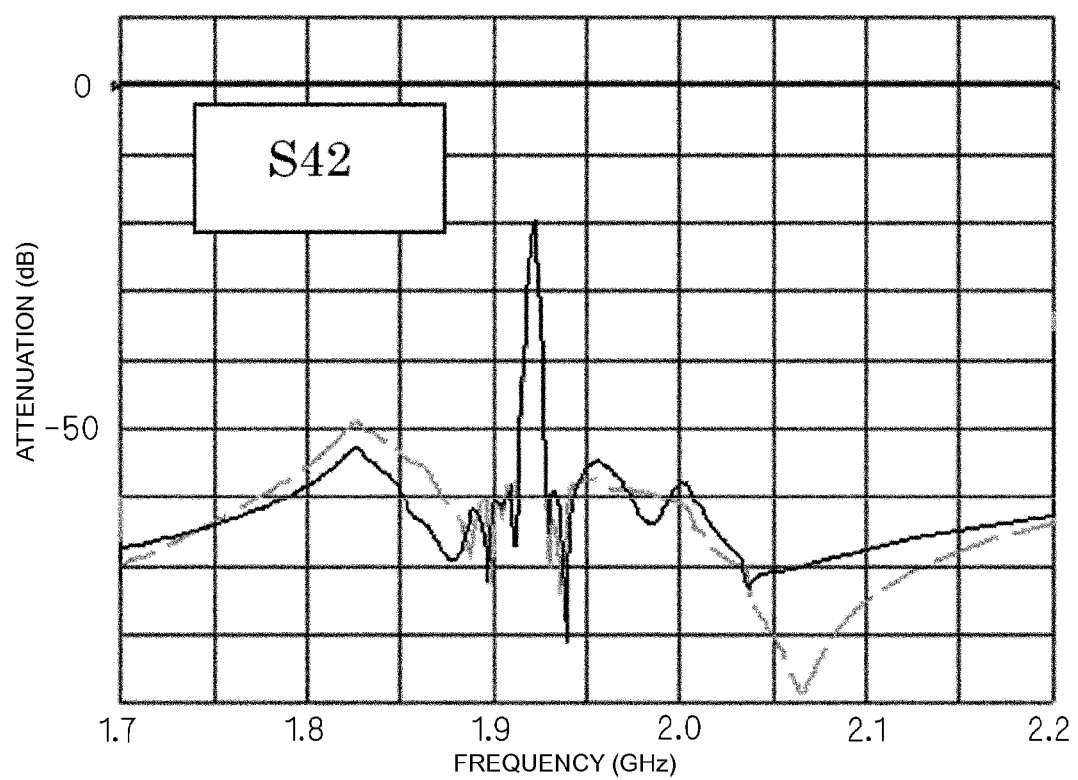
FIG. 10 is a graph illustrating an isolation characteristic according to the first preferred embodiment of the present invention and a comparative example.
Figure 11:
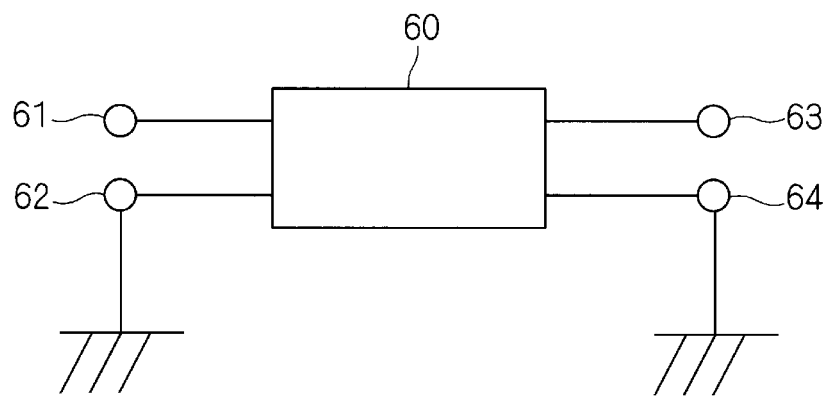
FIG. 11 is a diagram of a circuit having two terminal pairs.
Figure 12:
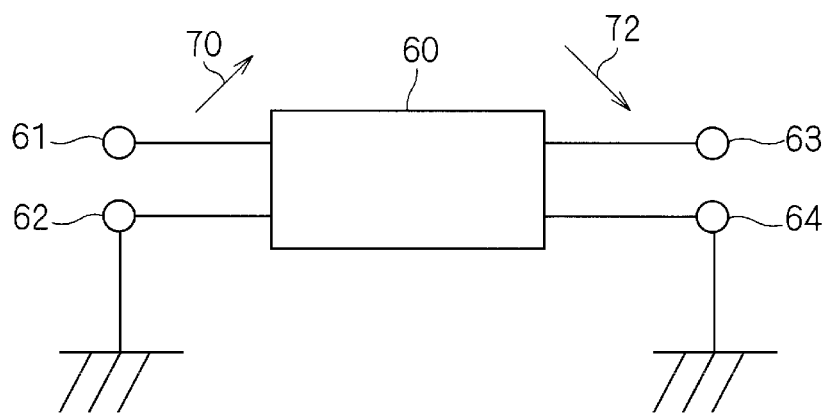
FIG. 12 is an illustration to explain components of direct reaching waves.

FIGS. 9 and 10 are each a graph illustrating an isolation characteristic of a manufactured example of the electric wave duplexer. In each graph, a solid line represents the isolation characteristic of the manufactured example according to the first preferred embodiment of the present invention. A broken line represents the isolation characteristic of a manufactured example as a comparative example. The comparative example has a structure such that the chip element 14 is sealed off just by the sheet of resin 16 as illustrated in FIG. 2, and such that the recess 16s and the lower dielectric-constant portion 18a are not formed.

In the manufactured example, a ladder-type surface acoustic wave filter element is used as the transmission elastic wave filter element. A balanced filter element formed by longitudinally coupling surface acoustic wave resonators is used as the reception elastic wave filter element. The reception elastic wave filter element operates at a higher frequency than the transmission elastic wave filter element.

Figure 14:
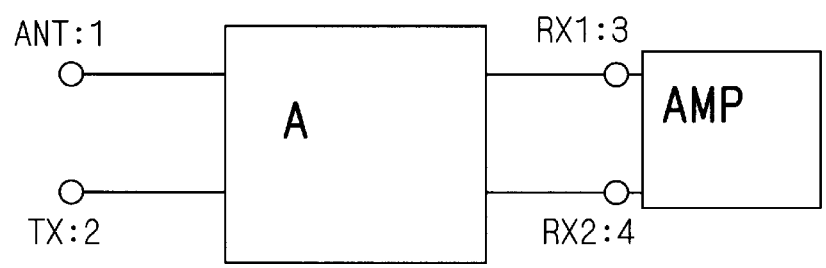
FIG. 14 is a circuit diagram of a balanced type duplexer.
Figure 15:
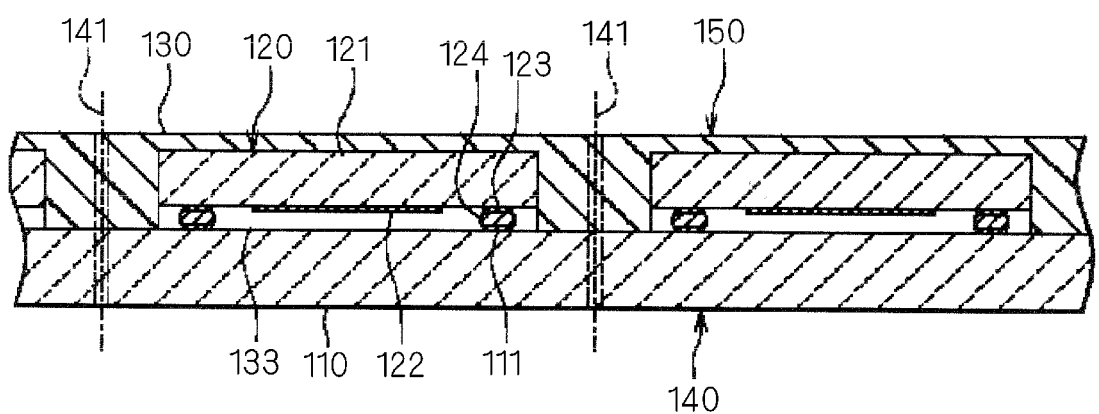
FIG. 15 is a sectional view of a conventional surface acoustic wave device.
Figure 16A:
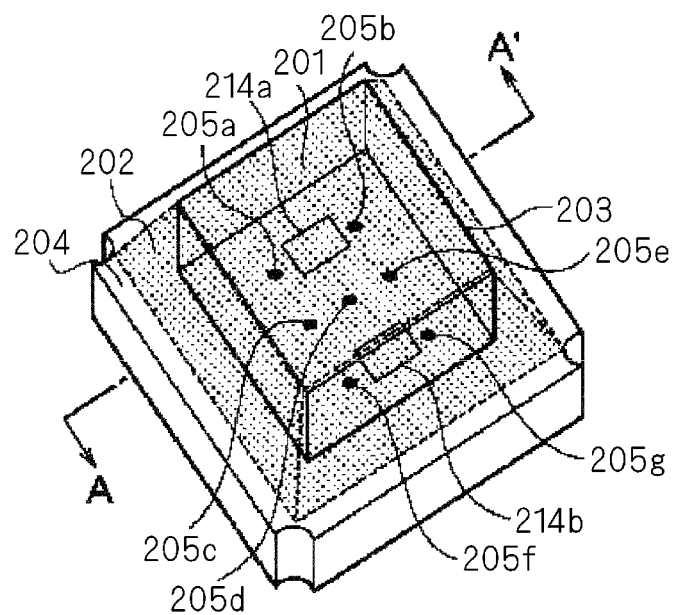
FIGS. 16A and 16B are respectively a perspective view and a sectional view of a conventional surface acoustic wave device.
Figure 16B:
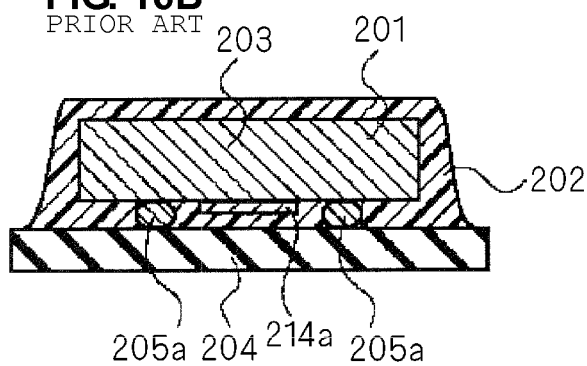

The manufactured example of the elastic wave duplexer is of the balanced type and includes total four ports ANT, TX, RX1 and RX2 as illustrated in a circuit diagram of FIG. 14. RX1 and RX2 are in phase opposite to each other. The balanced RX ports RX1 and RX2 are connected to an amplifier AMP. An isolation characteristic is usually represented by an attenuation occurred in a path from the TX port to the balanced RX port. Characteristics in the single-end mode are represented by S32 and S42 among 4-port S parameters before balance conversion. More specifically, S32 corresponds to TX-RX1, and S42 corresponds to TX-RX2. FIG. 9 illustrates an attenuation in terms of S32. FIG. 10 illustrates an attenuation in terms of S42.

As seen from FIGS. 9 and 10, since the lower dielectric-constant portion 18a is provided in the sealing member 15a, the attenuation is increased on the lower frequency side of a pass band and the isolation characteristic is improved.

Figure 13:
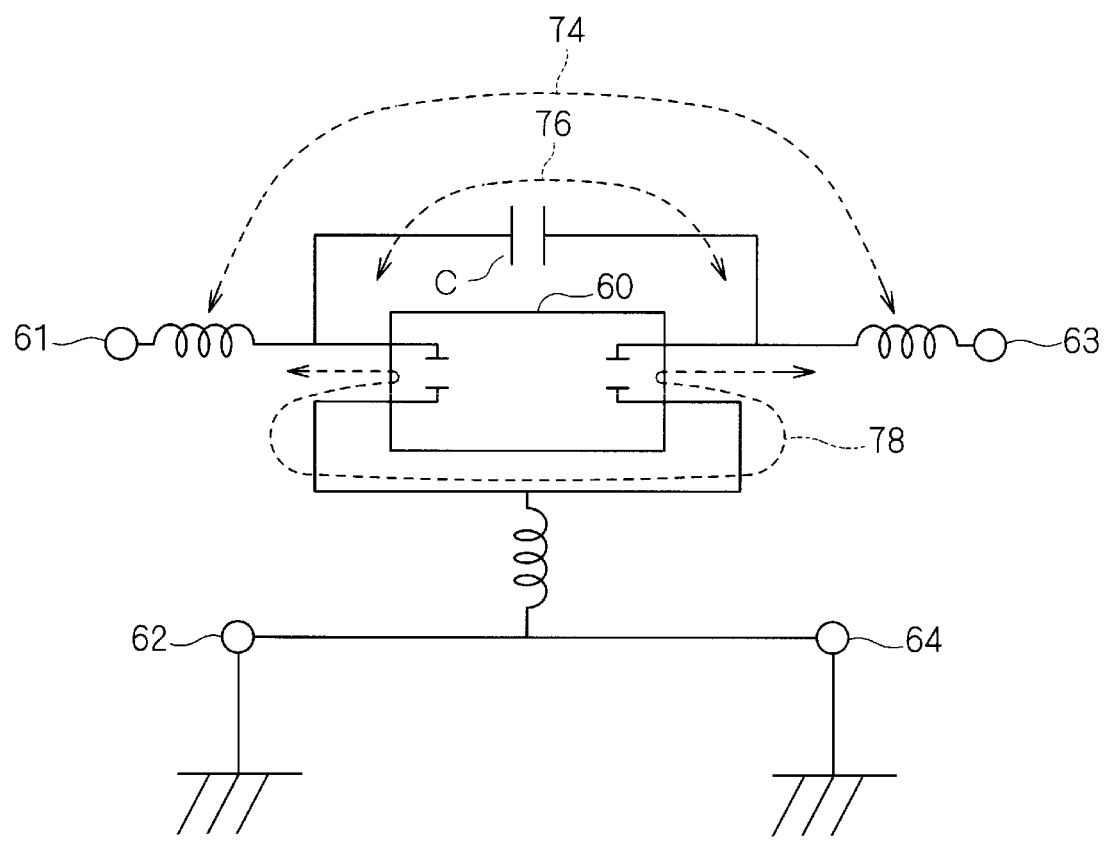
FIG. 13 is an equivalent circuit diagram to explain degradation in attenuation.

As a result of considering and analyzing the influence of a capacitance C attributable to the direct reaching waves, which causes the component 76 due to the capacitive coupling between the input terminals 61 and 62 and the output terminals 63 and 64 in the equivalent circuit model of FIG. 13, similar isolation characteristics to those illustrated in FIGS. 9 and 10 are obtained. Thus, it is understood that the isolation characteristic can be improved by reducing the capacitance C attributable to the direct reaching waves.

Stated another way, looking at the lower-frequency side isolation characteristic on the balanced side of the elastic wave duplexer in the single-end mode, capacitance is generated due to a leakage from the substrate and hence a parasitic capacitance is generated between ANT-RX, thus causing a direct reaching wave component. The larger the thickness of the resin forming the sealing member and the higher the dielectric constant thereof, the larger is the direct reaching wave component. As with the sealing member 15a in the first preferred embodiment, therefore, the generation of the capacitance can be prevented, the direct reaching wave component can be reduced, and the isolation characteristic can be improved by reducing the thickness of the base portion 16a above the chip element 14 and by replacing the base portion 16a with the lower dielectric-constant portion 18a made of the material having a lower dielectric constant.

In the balanced-type elastic wave duplexer, degradation in the isolation characteristic is not caused in the differential mode as a result of mutual cancellation of the generated components in terms of balanced characteristic. However, degradation in the isolation characteristic appears in the common mode or the single-end mode.

As long as the elastic wave duplexer has a structure capable of reducing the capacitance causing the direct reaching waves, it is possible to improve the isolation characteristic in other types of elastic wave duplexers as well than the balanced type.

Further, the advantage of improving the isolation characteristic can be obtained with structures in the following second to fifth preferred embodiments because those structures can also reduce the capacitance causing the direct reaching waves.

Second Preferred Embodiment

Figure 4:
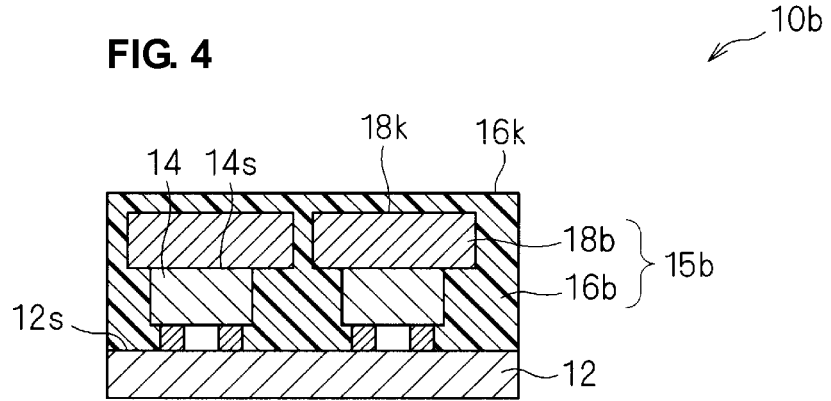
FIG. 4 is a sectional view of an elastic wave duplexer according to a second preferred embodiment of the present invention.

An elastic wave duplexer 10b according to a second preferred embodiment will be described with reference to FIG. 4. FIG. 4 is a sectional view of the elastic wave duplexer 10b.

As illustrated in FIG. 4, the elastic wave duplexer 10b according to the second preferred embodiment is constructed substantially similarly to the elastic wave duplexer 10a according to the first preferred embodiment. In the following, different points from the elastic wave duplexer 10a according to the first preferred embodiment are primarily described and similar components to those in the first preferred embodiment are denoted by the same reference characters.

The elastic wave duplexer 10b according to the second preferred embodiment differs from that according to the first preferred embodiment in the structure of a sealing member 15b. More specifically, a lower dielectric-constant portion 18b of the sealing member 15b is in contact with the upper surface 14s of each of the chip elements 14, i.e., the transmission elastic wave filter element and the reception elastic wave filter element. While the lower dielectric-constant portion 18b is covered with a base portion 16b of the sealing member 15b in FIG. 4, an upper surface 18k of the lower dielectric-constant portion 18b may be exposed to an upper surface 16k of the base portion 16b as in the first preferred embodiment.

The elastic wave duplexer 10b is manufactured, by way of example, as follows. A sheet of resin is overlaid on the upper surface 12s of the substrate 12 on which the chip elements are flip-chip mounted, and on respective upper surfaces of both the chip elements. Then, a through-hole is formed in the sheet of resin to make the upper surfaces 14s of the chip elements 14 exposed, and the second dielectric material is filled in the through-hole to form the lower dielectric-constant portion 18b. Thereafter, another sheet of resin is overlaid on the above-mentioned sheet of resin. Thus, the base portion 16b is formed by two sheets of resin in this second preferred embodiment.

As an alternative, the elastic wave duplexer 10b may be manufactured by arranging a member, which serves as the lower dielectric-constant portion 18b, on the upper surfaces 14s of the chip elements 14 that are flip-chip mounted to the substrate 12, and by placing a sheet of resin thereon.

With the elastic wave duplexer 10b, since the lower dielectric-constant portion 18b is disposed directly on the chip elements 14, i.e., the reception elastic wave filter element and the transmission elastic wave filter element, an effective dielectric constant can be reduced and hence the isolation characteristic can be improved as in the first preferred embodiment.

Further, since an upper surface of the elastic wave duplexer 10b is defined only by the upper surface 16k of the base portion 16b of the sealing member 15b, it is easier to make the thickness of the elastic wave duplexer 10b uniform.

Third Preferred Embodiment

Figure 5:
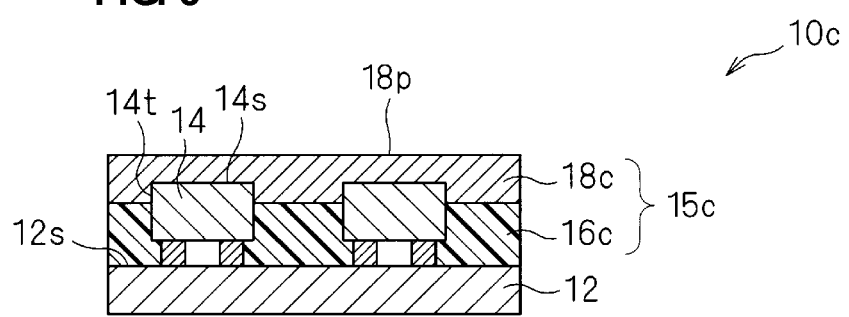
FIG. 5 is a sectional view of an elastic wave duplexer according to a third preferred embodiment of the present invention.

An elastic wave duplexer 10c according to a third preferred embodiment will be described with reference to FIG. 5. FIG. 5 is a sectional view of the elastic wave duplexer 10c.

As illustrated in FIG. 5, the elastic wave duplexer 10c according to the third preferred embodiment is constructed substantially similarly to the elastic wave duplexer 10a according to the first preferred embodiment.

The elastic wave duplexer 10c according to the third preferred embodiment differs from that according to the first preferred embodiment in the structure of a sealing member 15c. More specifically, the sealing member 15c includes two divided layers, i.e., a lower layer 16c made of a first dielectric material and an upper layer 18c made of a second dielectric material having a lower dielectric constant than that of the first dielectric material. The lower layer 16c of the sealing member 15c is formed on the upper surface 12s of the substrate 12 in such a thickness that an upper surface of the lower layer 16c is positioned midway of a lateral surface 14t of each of the two chip elements 14, i.e., the transmission elastic wave filter element and the reception elastic wave filter element. On the lower layer 16c, the upper layer 18c of the sealing member 15c is arranged so as to cover the upper surfaces 14s of the two chip elements 14, i.e., the transmission elastic wave filter element and the reception elastic wave filter element. The chip elements 14 are sealed off in a state surrounded by the substrate 12 and the lower layer 16c and the upper layer 18c of the sealing member 15c.

The lower layer 16c and the upper layer 18c of the sealing member 15c can be formed, for example, by stacking two sheets of resin one above the other.

With the elastic wave duplexer 10c, since the upper layer 18c having a relatively low dielectric constant is disposed around respective upper portions of the chip elements 14, i.e., the reception elastic wave filter element and the transmission elastic wave filter element, on a side located opposite from the substrate 12, an effective dielectric constant can be reduced and hence the isolation characteristic can be improved as in the first preferred embodiment.

Further, since an upper surface of the elastic wave duplexer 10c is defined only by an upper surface 18p of the upper layer 18c of the sealing member 15c, it is easier to make the thickness of the elastic wave duplexer 10c uniform.

Fourth Preferred Embodiment

Figure 6:
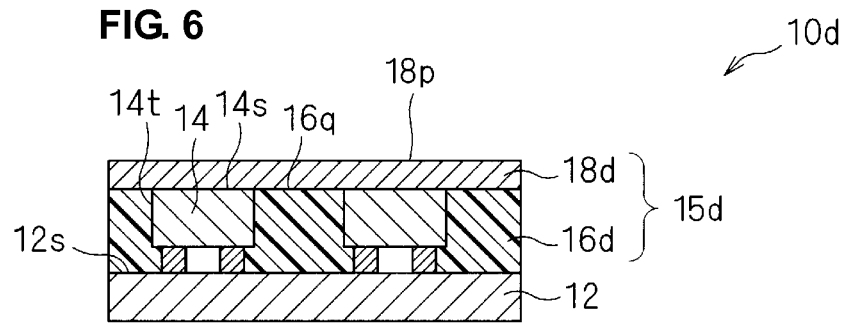
FIG. 6 is a sectional view of an elastic wave duplexer according to a fourth preferred embodiment of the present invention.

An elastic wave duplexer 10d according to a fourth preferred embodiment will be described with reference to FIG. 6. FIG. 6 is a sectional view of the elastic wave duplexer 10d.

As illustrated in FIG. 6, the elastic wave duplexer 10d according to the fourth preferred embodiment is constructed substantially similarly to the elastic wave duplexer 10c according to the third preferred embodiment.

The elastic wave duplexer 10d according to the fourth preferred embodiment differs from that according to the third preferred embodiment in structure of a sealing member 15d. More specifically, a lower layer 16d of the sealing member 15d preferably has the same height as the upper surfaces 14s of the two chip elements 14, i.e., the transmission elastic wave filter element and the reception elastic wave filter element, which are mounted to the upper surface 12s of the substrate 12. An upper layer 18d of the sealing member 15d is arranged on the lower layer 16d so as to cover the upper surfaces 14s of the two chip elements 14.

With the elastic wave duplexer 10d, since the upper layer 18d having a relatively low dielectric constant is disposed on an upper side (on the side located opposite from the substrate 12) of the upper surfaces 14s of the chip elements 14, i.e., the reception elastic wave filter element and the transmission elastic wave filter element, an effective dielectric constant can be reduced and hence the isolation characteristic can be improved as in the first preferred embodiment.

Further, since an upper surface of the elastic wave duplexer 10d is defined only by an upper surface 18p of the upper layer 18d of the sealing member 15d, it is easier to make the thickness of the elastic wave duplexer 10d uniform.

Fifth Preferred Embodiment

An elastic wave duplexer 10e according to a fifth preferred embodiment will be described with reference to FIGS. 7 and 8.

Figure 7:
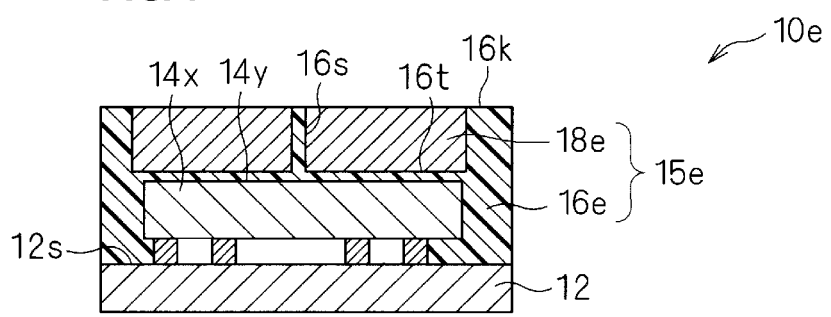
FIG. 7 is a sectional view of an elastic wave duplexer according to a fifth preferred embodiment of the present invention.
Figure 8:
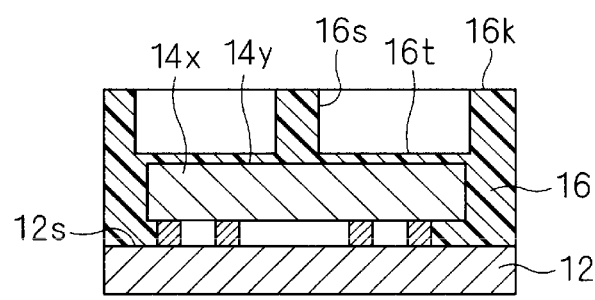
FIG. 8 is a sectional view to explain a manufacturing process of the elastic wave duplexer according to the fifth preferred embodiment of the present invention.

FIG. 7 is a sectional view of the elastic wave duplexer 10e. In the elastic wave duplexer 10e according to the fifth preferred embodiment, as illustrated in FIG. 7, a chip element 14x mounted to the substrate 12 is sealed off by a sealing member 15e, as in the elastic wave duplexer 10a according to the first preferred embodiment.

In the elastic wave duplexer 10e according to the fifth preferred embodiment, unlike the first preferred embodiment, the transmission elastic wave filter element and the reception elastic wave filter element are integrated into the single chip element 14x.

Recesses 16s are formed in an upper surface 16k of a base portion 16e of a sealing member 15e. In order to prevent the generation of the capacitance causing the direct reaching waves, the recesses 16s are formed to face at least respective portions of the chip element 14x where the transmission elastic wave filter element and the reception elastic wave filter element are located in the chip element 14x.

The elastic wave duplexer 10e according to the fifth preferred embodiment can be manufactured as in the first preferred embodiment. As illustrated in a sectional view of FIG. 8, by way of example, a sheet of resin 16 made of a first dielectric material is overlaid on the upper surface 12s of the substrate 12 to which the chip element 14x is flip-chip mounted, and the recesses 16s are formed in the sheet of resin 16. Then, a lower dielectric-constant portion 18e is formed in each of the recesses 16s, as illustrated in FIG. 7, by using a second dielectric material that has a lower dielectric constant than the first dielectric material.

In the elastic wave duplexer 10e, the lower dielectric-constant portion 18e is disposed directly on the transmission elastic wave filter element and the reception elastic wave filter element, which are integrated into the chip element 14x. With such an arrangement, an effective dielectric constant can be reduced and hence the isolation characteristic can be improved as in the first preferred embodiment.

The sealing member in the elastic wave duplexer including the single chip element in which both the transmission elastic wave filter element and the reception elastic wave filter element are provided may be formed as with the sealing members in the second to fourth preferred embodiments.

While, in the first to fourth preferred embodiments, the lower dielectric-constant portions 18a to 18d each preferably have a larger size than the chip element 14 as illustrated in FIGS. 1 and 4 to 6, for example, a similar advantage can be obtained even when the lower dielectric-constant portion has a smaller size than the chip element 14. Further, even when the material having the lower dielectric constant is not filled into the recesses, i.e., even in the state illustrated in each of FIGS. 3 and 8, a condition similar to the case of filling the material having the lower dielectric constant into the recesses is obtained because the recesses are filled with air that has a lower dielectric constant. Accordingly, an advantage of increasing the attenuation can be obtained at a level equivalent or superior to the case in which the lower dielectric-constant portion is formed by filling the material having the lower dielectric constant into the recesses.

A high degree of isolation can be realized between a transmission terminal and a first reception terminal and between the transmission terminal and a second reception terminal of an elastic wave duplexer by providing a portion having a relatively low dielectric constant as a portion of a sealing member arranged to seal off a transmission elastic wave filter element and a reception elastic wave filter element, which are flip-chip mounted to a substrate.

The present invention is not limited to the above-described preferred embodiments and can be carried out with various modifications.

For example, the transmission elastic wave filter element and the reception elastic wave filter element included in the elastic wave duplexer are not limited to filter elements utilizing surface acoustic waves (SAW), and may be filter elements utilizing other types of elastic waves, such as boundary waves and bulk elastic waves.

While preferred embodiments of the present invention have been described above, it is to be understood that variations and modifications will be apparent to those skilled in the art without departing the scope and spirit of the present inven-

What is claimed is:

1. An elastic wave duplexer comprising:
   a substrate;
   a transmission elastic wave filter element that is flip-chip mounted to a principal surface of the substrate;
   a reception elastic wave filter element that is flip-chip mounted to the principal surface of the substrate; and
   a sealing member arranged on the principal surface of the substrate to cover the transmission elastic wave filter element and the reception elastic wave filter element, which are flip-chip mounted to the principal surface of the substrate, and to seal off the transmission elastic wave filter element and the reception elastic wave filter element, the sealing member including:
      a base portion in contact with the principal surface of the substrate and made of a first dielectric material; and
      a lower dielectric-constant portion made of a second dielectric material having a dielectric constant lower than that of the first dielectric material and located in at least one of a region of the sealing member that faces the transmission elastic wave filter element on a side opposite from the substrate with respect to the transmission elastic wave filter element and a region of the sealing member that faces the reception elastic wave filter element on a side opposite from the substrate with respect to the reception elastic wave filter element.

2. The elastic wave duplexer according to claim 1, wherein the lower dielectric-constant portion of the sealing member is provided with a gap between at least one of the transmission elastic wave filter element and the reception elastic wave filter element; and
   a thickness of the lower dielectric-constant portion of the sealing member is larger than at least one of a thickness of the sealing member interposed between the lower dielectric-constant portion of the sealing member and the transmission elastic wave filter element, and a thickness of the sealing member interposed between the lower dielectric-constant portion of the sealing member and the reception elastic wave filter element.

3. The elastic wave duplexer according to claim 1, wherein the lower dielectric-constant portion of the sealing member is in contact with at least one of the transmission elastic wave filter element on a side thereof located oppositely from the substrate and the reception elastic wave filter element on a side thereof located oppositely from the substrate.

4. The elastic wave duplexer according to claim 1, wherein at least one of the first dielectric material and the second dielectric material is a resin.

5. The elastic wave duplexer according to claim 1, wherein the transmission elastic wave filter element and the reception elastic wave filter element are separate chip elements.

6. The elastic wave duplexer according to claim 1, wherein the transmission elastic wave filter element and the reception elastic wave filter element are integrated into a single chip element.

7. The elastic wave duplexer according to claim 1, wherein the reception elastic wave filter element is a balanced filter element.

* * * * *